United States Patent
Tomita

(10) Patent No.: US 12,154,836 B2
(45) Date of Patent: Nov. 26, 2024

(54) SEMICONDUCTOR DEVICE WITH SPACED APART CONTAINERS

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hisashi Tomita, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 330 days.

(21) Appl. No.: 17/685,253

(22) Filed: Mar. 2, 2022

(65) Prior Publication Data

US 2023/0092403 A1   Mar. 23, 2023

(30) Foreign Application Priority Data

Sep. 22, 2021 (JP) .................. 2021-154194

(51) Int. Cl.
*H01L 23/049* (2006.01)
*H01L 23/373* (2006.01)
(Continued)

(52) U.S. Cl.
CPC ........ *H01L 23/049* (2013.01); *H01L 23/3735* (2013.01); *H01L 23/473* (2013.01); *H01L 23/50* (2013.01)

(58) Field of Classification Search
CPC .................................................. H01L 23/049
(Continued)

(56) References Cited

U.S. PATENT DOCUMENTS

| 8,946,889 B2 | 2/2015 | Katou et al. |
| 10,304,756 B2 | 5/2019 | Inoue |

(Continued)

FOREIGN PATENT DOCUMENTS

| JP | 2011187523 A | 9/2011 |
| JP | 5273101 B2 | 8/2013 |

(Continued)

OTHER PUBLICATIONS

Yoshihisa Uchida et al., "Wiring Technologies Development to Improve Power Module Performance", Mitsubishi Electric Advance, vol. 172, Dec. 2020, pp. 5-8.

(Continued)

*Primary Examiner* — Ajay Arora
(74) *Attorney, Agent, or Firm* — Kim & Stewart LLP

(57) ABSTRACT

According to one embodiment, a semiconductor device includes a first container and a second container. The second container is inside the first container. A semiconductor element is inside the second container. The second container is formed of a lower portion, a side portion fixed to the lower portion, and an upper portion fixed to the side portion and the first container. The side portion is a first metal material covered with a first insulator. The lower portion and the side portion of the second container are spaced from the first container. The semiconductor device may be used as a power module or the like in some instances, and the semiconductor element may be one or more transistors of the like.

20 Claims, 7 Drawing Sheets

(51) Int. Cl.
*H01L 23/473* (2006.01)
*H01L 23/50* (2006.01)

(58) Field of Classification Search
USPC .......................................................... 257/691
See application file for complete search history.

(56) References Cited

U.S. PATENT DOCUMENTS

| | | |
|---|---|---|
| 2009/0213553 A1 | 8/2009 | Tschirbs et al. |
| 2013/0176761 A1 | 7/2013 | Hattori et al. |
| 2016/0254255 A1* | 9/2016 | Hori ..................... H01L 23/16 |
| | | 257/685 |
| 2017/0219301 A1* | 8/2017 | Lin ..................... F28F 13/00 |
| 2018/0041136 A1 | 2/2018 | Tokuyama et al. |

FOREIGN PATENT DOCUMENTS

| | | |
|---|---|---|
| JP | 2016162986 A | 9/2016 |
| JP | 6384609 B2 | 9/2018 |
| JP | 6696380 B2 * | 5/2020 |
| WO | 2012043088 A1 | 4/2012 |
| WO | 2015174158 A1 | 11/2015 |

OTHER PUBLICATIONS

Yoshihisa Uchida et al., "Wiring Technologies Development to Improve Power Module Performance", Mitsubishi Electric Advance, vol. 94, No. 3, 2020, 4 pages (in Japanese).
Japanese Office Action dated Jul. 16, 2024, mailed in counterpart Japanese Application No. 2021-154194, 8 pages (with translation).

* cited by examiner

SEMICONDUCTOR DEVICE WITH SPACED APART CONTAINERS

CROSS-REFERENCE TO RELATED APPLICATION(S)

This application is based upon and claims the benefit of priority from Japanese Patent Application No. 2021-154194, filed Sep. 22, 2021, the entire contents of which are incorporated herein by reference.

FIELD

Embodiments described herein relate generally to a semiconductor device such as a power module.

BACKGROUND

A power module is known as a semiconductor device that realizes high output. The power module is configured as a single package in which a plurality of power semiconductors are integrated.

DETAILED DESCRIPTION

Figure 1:
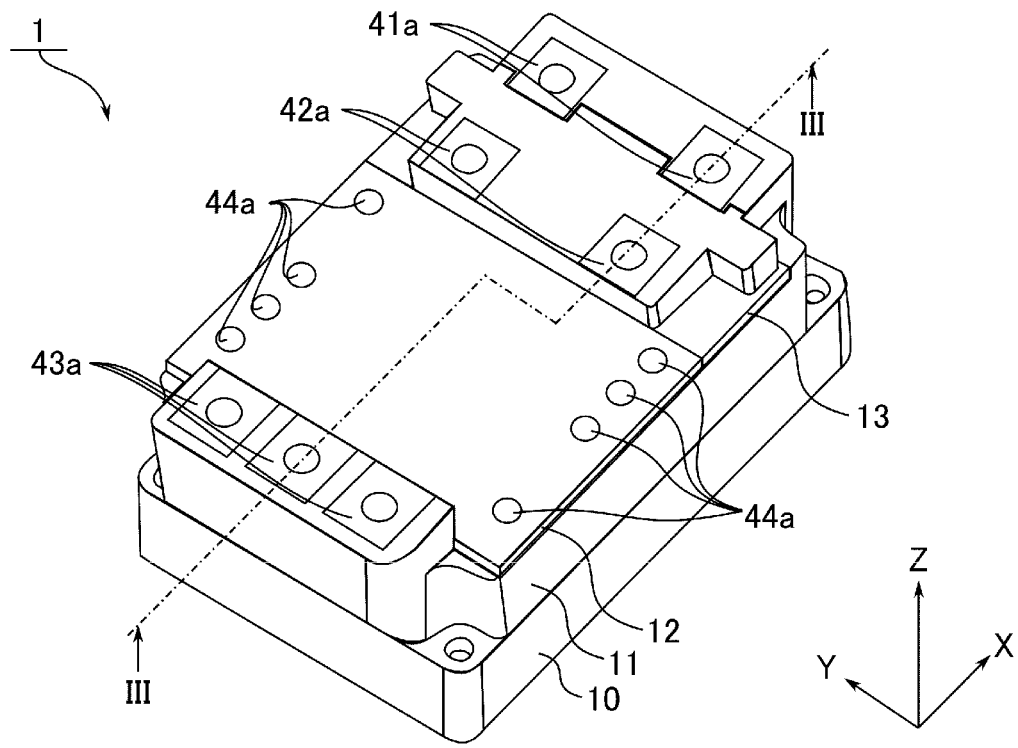
FIG. 1 is a perspective view showing an external structure of a semiconductor device according to a first embodiment.

In general, according to one embodiment, a semiconductor device includes a first container and a second container that is inside the first container. A semiconductor element is inside the second container. The second container comprises a lower portion, a side portion that is fixed to the lower portion, and an upper portion that is fixed to the side portion and also the first container. The side portion is a first metal material covered with a first insulator. The lower portion and the side portion of the second container are spaced from the first container.

Hereinafter, certain example embodiments will be described with reference to the drawings. Dimensions and proportions of the drawings are not always the same as the actual devices.

In the following description, elements having substantially the same functions and configurations are indicated by the same reference numerals. When elements having the same structure are to be particularly distinguished from each other, different letters or numbers may be added at the end of the reference numerals.

1. First Embodiment

The semiconductor device according to the first embodiment is a power module. The semiconductor device according to the first embodiment can be applied to, for example, a power conversion device for a railroad vehicle, an industrial device for a renewable-energy electricity generation system, or the like.

1.1 Configuration

A configuration of the semiconductor device according to the first embodiment will be described.

1.1.1 External Structure

First, an external structure of the semiconductor device according to the first embodiment will be described.

FIG. 1 is a perspective view showing an example of the external structure of a semiconductor device 1 according to the first embodiment. The semiconductor device 1 includes an outer base substrate 10, an outer case 11, an outer lid 12, and an outer lid 13, which together constitute an outer container. The outer container of the semiconductor device 1 houses an inner container of the semiconductor device 1. A circuit including a semiconductor element or elements is housed in the inner container of the semiconductor device 1.

The outer base substrate 10 is a support including a flat plate-shaped portion. The outer base substrate 10 corresponds to a lower portion of the outer container of the semiconductor device 1. The outer base substrate 10 has, for example, screw holes at four corners. The outer base substrate 10 may be fixed to another device outside the semiconductor device 1 via the screw holes. The outer base substrate 10 comprises copper (Cu) or ceramic material, for example. When copper (Cu) is used, it is desirable that the outer base substrate 10 be supplied with a corrosion-proof plating.

The outer case 11 is provided on an upper surface of the outer base substrate 10. The outer case 11 is an insulator having a square tubular portion. The outer case 11 corresponds to a side portion of the outer container of the semiconductor device 1. The outer case 11 is fixed to the outer base substrate 10. The outer case 11 comprises, for example, poly-phenylene sulfide (PPS).

The outer lids 12 and 13 are provided on the upper surface of the outer case 11. The outer lids 12 and 13 are insulators having flat plate-shaped portions. The outer lids 12 and 13 correspond to an upper portion of the outer container of the semiconductor device 1. The outer lids 12 and 13 are fixed to the outer case 11. The outer lids 12 and 13 comprise, for example, PPS.

The outer base substrate 10, the outer case 11, and the outer lids 12 and 13 are assembled to provide an interior space in which the inner container can be arranged inside the outer container. In the following description, a plane parallel to the contact surface between the outer base substrate 10 and the outer case 11 is referred to as an XY plane. In the XY plane, a long side direction of the outer base substrate 10 is referred to as an X direction, and a short side direction of the outer base substrate 10 is referred to as a Y direction. The direction of the outer case 11 from the outer base substrate 10 is referred to as a Z direction or upward direction.

The semiconductor device 1 further includes a plurality of terminals 41a, 42a, 43a, and 44a.

Each of the plurality of terminals 41a to 44a is an end portion of a bus bar that electrically connects the device outside the semiconductor device 1 to the internal circuit configuration of the semiconductor device 1. The example of FIG. 1 shows two terminals 41a, two terminals 42a, three terminals 43a, and eight terminals 44a.

The two terminals 41a are positive (P) terminals. The two terminals 41a can be electrically connected to each other.

The two terminals 41a are between the outer case 11 and the outer lid 13 and arranged in parallel to each other. The two terminals 41a are spaced from each other in the Y direction.

The two terminals 42a are negative (N) terminals. The two terminals 42a can be electrically connected to each other. The two terminals 42a between the outer lid 12 and the outer lid 13 and are arranged in parallel to each other. The two terminals 42a are spaced from each other in the Y direction.

The three terminals 43a are alternating current (AC) terminals. The three terminals 43a can be electrically connected to one another. The three terminals 43a are arranged in parallel to each other between the outer case 11 and the outer lid 12. The three terminals 43a are spaced from each other in the Y direction.

The eight terminals 44a are control terminals and/or monitor terminals. The control terminals are, for example, terminals for controlling driving of the semiconductor element(s) in the semiconductor device 1. The monitor terminals are, for example, terminals for monitoring electrical characteristics of the circuit(s) in the semiconductor device 1. The eight terminals 44a are insulated from one another. The eight terminals 44a are arranged in a manner that four terminals 44a are aligned in a row along the X direction on two opposite sides of the outer lid 12, the rows being spaced from each other in the Y direction.

1.1.2 Circuit Configuration

Figure 2:
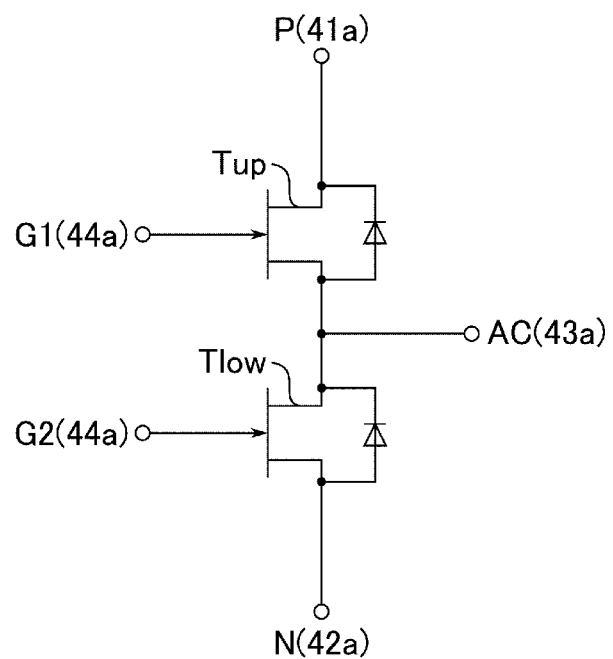
FIG. 2 is a circuit diagram of a semiconductor device according to a first embodiment.

FIG. 2 is a circuit diagram showing an example of a circuit configuration of the semiconductor device 1 according to the first embodiment. The example of FIG. 2 shows a case where the semiconductor device 1 includes transistors Tup and Tlow as internal semiconductor elements.

The transistors Tup and Tlow are metal-oxide-semiconductor (MOS) transistors. The transistors Tup and Tlow are n-type transistors. The transistors Tup and Tlow are connected in series.

Specifically, the transistor Tup includes a drain end connected to a node P, a source end connected to a node AC, and a gate end connected to a node G1. The transistor Tlow includes a drain end connected to the node AC, a source end connected to a node N, and a gate end connected to a node G2. The node P corresponds to the terminal 41a, the node N corresponds to the terminal 42a, and the node AC corresponds to the terminal 43a. The nodes G1 and G2 respectively correspond to two different control terminals among the terminals 44a.

According to the above configuration, the internal semiconductor elements of the semiconductor device 1 can be controlled by a voltage supplied from the outside of the semiconductor device 1.

The circuit configuration of the semiconductor device 1 is not limited to the example of FIG. 2. For example, the transistors Tup and Tlow may be insulated-gate bipolar transistors (IGBTs). The example of FIG. 2 shows one transistor Tup and one transistor Tlow, but is not limited to this case. For example, each of the transistors Tup and Tlow may be implemented as a plurality of transistors connected in parallel with one another.

1.1.3 Cross-Sectional Structure

Figure 3:
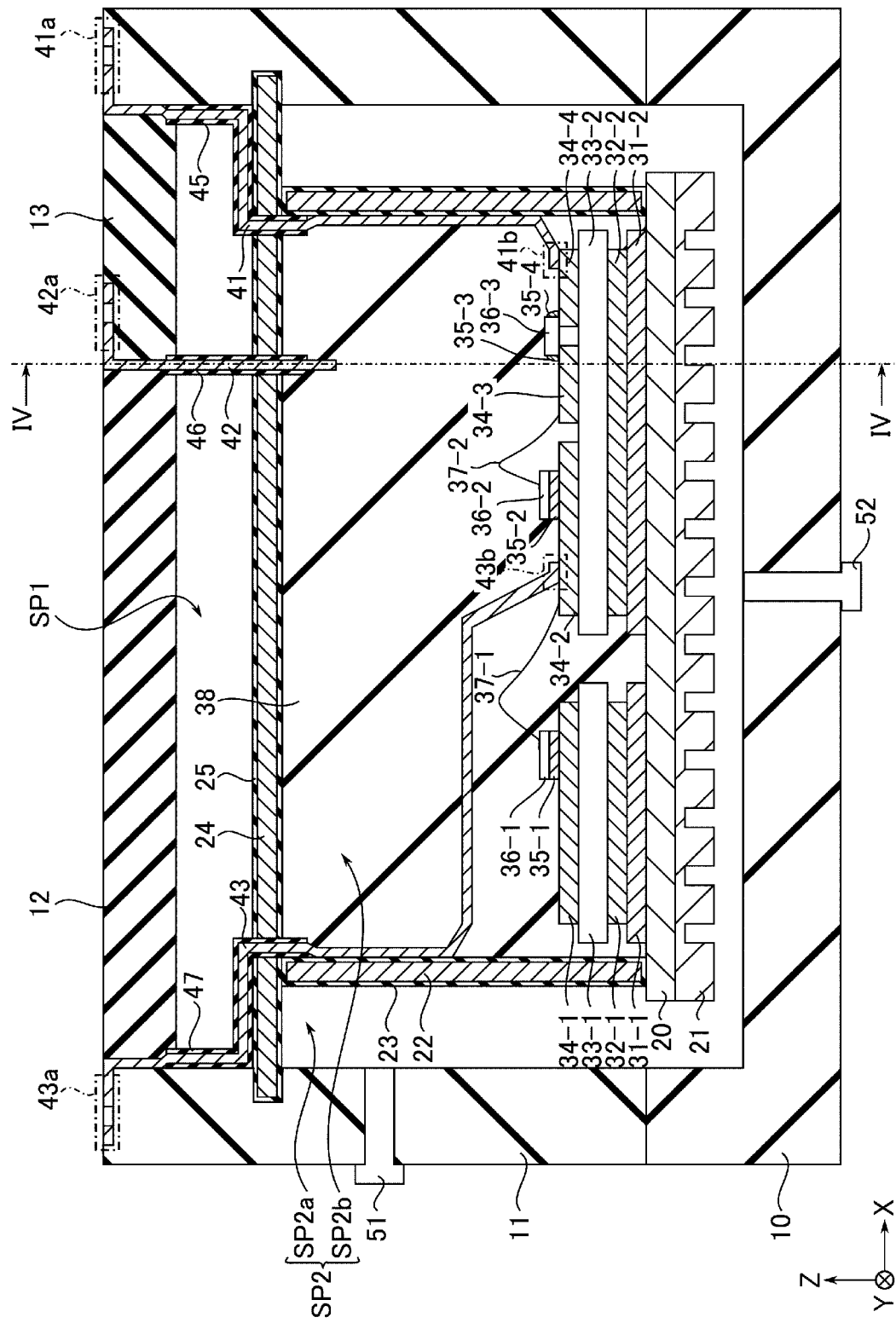
FIG. 3 is a cross-sectional view of a semiconductor device according to a first embodiment.
Figure 4:
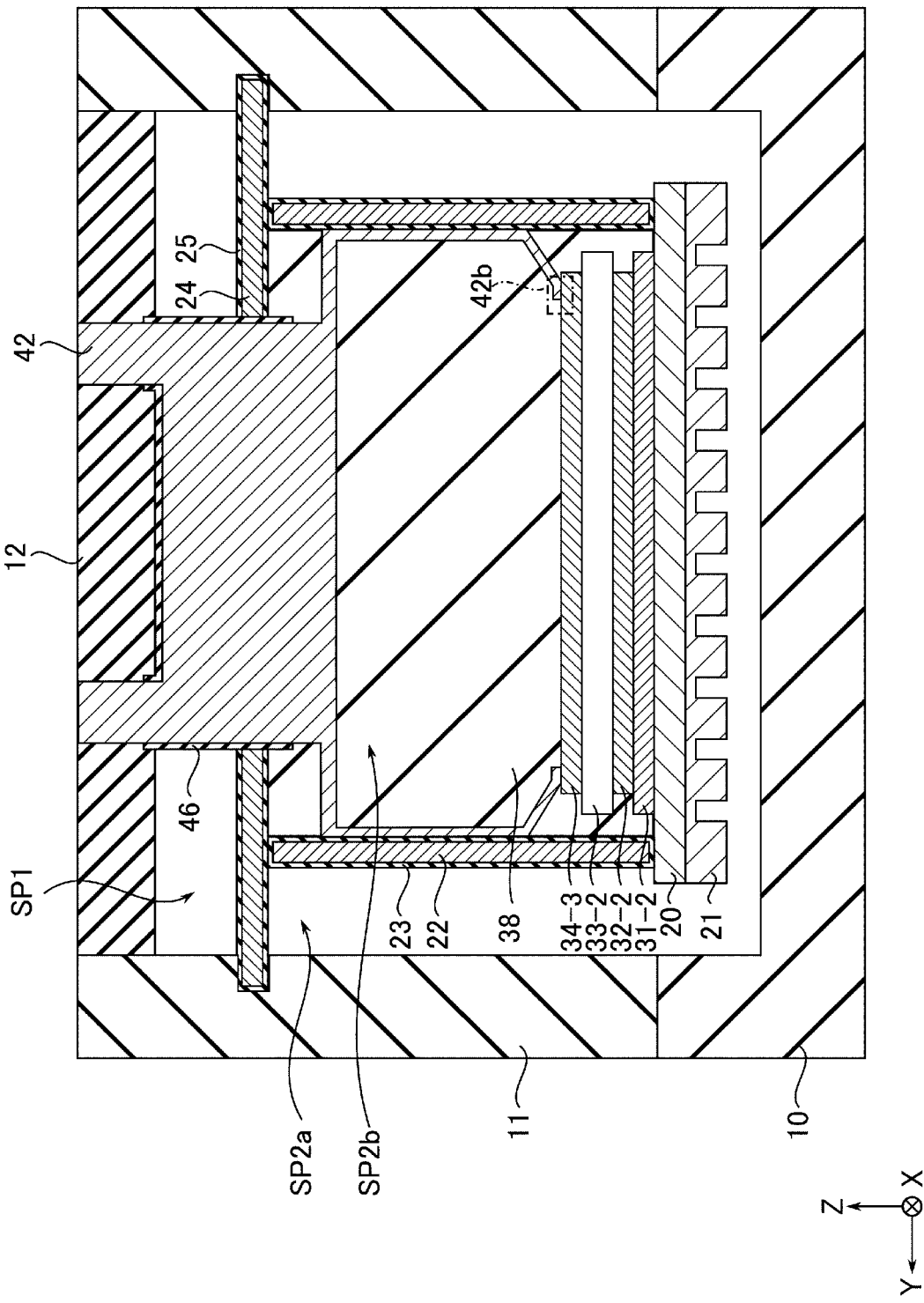
FIG. 4 is another cross-sectional view of a semiconductor device according to a first embodiment.

FIG. 3 is a cross-sectional view taken along the line III-III of FIG. 1, showing an example of the cross-sectional structure of the semiconductor device 1 according to the first embodiment. FIG. 4 is a cross-sectional view taken along the line IV-IV of FIG. 3, showing an example of the cross-sectional structure of the semiconductor device 1 according to the first embodiment. FIGS. 3 and 4 show the cross sections of the semiconductor device 1 along two planes that intersect each other, respectively.

The semiconductor device 1 includes an inner base substrate 20, a heat dissipation member 21, an inner case 22, an insulating film 23, an inner lid 24, and an insulating film 25, which together constitute the inner container. The semiconductor device 1 further includes a plurality of connection members 31, a plurality of wirings 32, a plurality of insulating substrates 33, a plurality of wirings 34, a plurality of connection members 35, a plurality of semiconductor elements 36, a plurality of wires 37, and a sealing member 38, which together constitute the circuit structure(s) or the like within the inner container. The plurality of connection members 31 include connection members 31-1 and 31-2. The plurality of wirings 32 include wirings 32-1 and 32-2. The plurality of insulating substrates 33 include insulating substrates 33-1 and 33-2. The plurality of wirings 34 include wirings 34-1, 34-2, 34-3, and 34-4. The plurality of connection members 35 include connection members 35-1, 35-2, 35-3, and 35-4. The plurality of semiconductor elements 36 include semiconductor elements 36-1, 36-2, and 36-3. The plurality of wires 37 include wires 37-1 and 37-2. The semiconductor device 1 further includes a plurality of bus bars 41, 42, and 43, and a plurality of protective films 45, 46, and 47. The semiconductor device 1 further includes an injection portion 51 and a discharge portion 52.

First, the inner container of the semiconductor device 1 will be described.

The inner base substrate 20 is a conductor having a flat plate-shaped portion. The inner base substrate 20 corresponds to the lower portion of the inner container of the semiconductor device 1. The inner base substrate 20 extends in the XY plane in the interior space formed by the outer container of the semiconductor device 1 without contacting the outer container of the semiconductor device 1. The inner base substrate 20 comprises, for example, copper (Cu) or ceramic material. When copper (Cu) is used, it is desirable that the inner base substrate 20 is supplied with a corrosion-proof plating. The potential of the inner base substrate 20 is a ground level (for example, 0 V) during operations of the semiconductor device 1. That is, the inner base substrate 20 can be said to be grounded.

The inner base substrate 20 is provided with a heat dissipation member 21 on a lower surface thereof. The heat dissipation member 21 is a heat sink. The heat dissipation member 21 has a relatively large surface area due to the unevenness on its lower surface. The heat dissipation member 21 comprises, for example, copper (Cu) or ceramic materials. When copper (Cu) is used, it is desirable that the heat dissipation member 21 is supplied with a corrosion-proof plating.

In some examples, the heat dissipation member 21 may be integrally formed along with the inner base substrate 20.

The inner case 22 is provided on the upper surface of the inner base substrate 20. The inner case 22 is a piece of metal having a square tubular portion. The inner case 22 corresponds to the side portion of the inner container of the semiconductor device 1. The inner case 22 is fixed to the inner base substrate 20. The inner case 22 comprises, for example, aluminum (Al) or copper (Cu).

The insulating film 23 covers the inner case 22. When the inner case 22 is made of aluminum (Al), the insulating film 23 is formed, for example, by anodizing the inner case 22. In this case, the insulating film 23 comprises, for example, alumina.

The inner lid 24 is provided on the upper surface of the inner case 22. The inner lid 24 is a piece of metal having a flat plate-shaped portion. The inner lid 24 corresponds to the upper portion of the inner container of the semiconductor device 1. The inner lid 24 comprises, for example, aluminum (Al) or copper (Cu). The inner lid 24 can be fixed to the outer case 11 and the inner case 22. In the example of FIG. 3, in a plan view, the outer edge of the inner lid 24 is located outside (beyond) the inner edge of the outer case 11.

The insulating film 25 covers the inner lid 24. When the inner lid 24 is made of aluminum (Al), the insulating film 25 is formed, for example, by anodizing the inner lid 24. In this case, the insulating film 25 comprises, for example, alumina.

The inner base substrate 20, the inner case 22, and the inner lid 24 as described above are assembled together to form the inner container. The inner container is fixed to the outer container via the inner lid 24. That is, the inner container includes a lower portion, a side portion provided on the lower portion, and an upper portion provided on the side portion. The upper portion is fixed to the outer container. The lower portion of the inner container includes the inner base substrate 20 and the heat dissipation member 21. The side portion of the inner container includes the inner case 22 covered with the insulating film 23. The upper portion of the inner container includes the inner lid 24 that is covered with the insulating film 25.

The space within the outer container is partitioned into a space SP1 and a space SP2 by the inner lid 24. The space SP1 is above the inner lid 24. The space SP2 is below the inner lid 24. The space SP2 is further divided into a space SP2*a* and a space SP2*b*.

The space SP2*a* is outside the inner container (that is, on lateral and lower sides of the inner container) within the space SP2. More specifically, the space SP2*a* is surrounded by the outer base substrate 10, the outer case 11, the inner lid 24, the inner case 22, the inner base substrate 20, and the heat dissipation member 21. That is, the inner base substrate 20 and the heat dissipation member 21 are separated from the outer container by the space SP2*a*. Similarly, the inner case 22 and the insulating film 23 are separated from the outer container by the space SP2*a*. The space SP2*a* preferably has a width (that is, a distance between the inner case 22 and the outer case 11, and a distance between the heat dissipation member 21 and the outer base substrate 10) of 3 millimeters to 30 millimeters.

The space SP2*b* is in the inner container within space SP2. More specifically, the space SP2*b* is surrounded by the inner lid 24, the inner case 22, and the inner base substrate 20.

Any gaps between the members constituting the inner container and the outer container are sealed so that fluids do not leak from the space SP2*a* into the spaces SP1 and SP2*b*. That is, the inner container and the outer container separate the space SP2*a* from the spaces SP1 and SP2*b* in an airtight manner.

Next, the structure within the space SP2*b* will be described.

The wirings 32-1 and 32-2 are provided on the upper surface of the inner base substrate 20 via the connection members 31-1 and 31-2, respectively. The connection members 31-1 and 31-2 are, for example, solder. The connection member 31-1 physically and electrically connects the wiring 32-1 to the inner base substrate 20. The connection member 31-2 physically and electrically connects the wiring 32-2 to the inner base substrate 20. The wirings 32-1 and 32-2 are grounded (for example, 0 V). The wiring 32-1 and 32-2 comprise, for example, copper (Cu).

The insulating substrate 33-1 is provided on the upper surface of the wiring 32-1, and the insulating substrate 33-2 is provided on the upper surface of the wiring 32-2. The insulating substrates 33-1 and 33-2 comprise, for example, silicon nitride (SiN).

The wiring 34-1 is provided on the upper surface of the insulating substrate 33-1, and the wirings 34-2, 34-3, and 34-4 are provided on the upper surface of the insulating substrate 33-2. The wirings 34-1 to 34-4 are conductive paths within the semiconductor device 1. Specifically, for example, the wirings 34-1 and 34-4 are electrically connected to the node P. The wiring 34-2 is electrically connected, for example, to the node AC. The wiring 34-3 is electrically connected, for example, to the node N. The wirings 34-1 to 34-4 comprise, for example, copper (Cu).

The semiconductor element 36-1 is provided on the upper surface of the wiring 34-1 via the connection member 35-1. The semiconductor element 36-2 is provided on the upper surface of the wiring 34-2 via the connection member 35-2. The connection members 35-1 and 35-2 are, for example, silver (Ag) sintered materials. The connection member 35-1 physically and electrically connects the wiring 34-1 to the semiconductor element 36-1. The connection member 35-2 physically and electrically connects the wiring 34-2 to the semiconductor element 36-2. The semiconductor elements 36-1 and 36-2 are, for example, the transistors Tup and Tlow, respectively. The lower surface of the semiconductor element 36-1 corresponds to the drain end of the transistor Tup, and the lower surface of the semiconductor element 36-2 corresponds to the drain end of the transistor Tlow. That is, the wiring 34-1 electrically connects the node P and the drain end of the transistor Tup. The wiring 34-2 electrically connects the node AC and the drain end of the transistor Tlow.

The connection member 35-3 is provided on the upper surface of the wiring 34-3, and the connection member 35-4 is provided on the upper surface of the wiring 34-4. The connection members 35-3 and 35-4 are, for example, solder. The semiconductor element 36-3 connects the wiring 34-3 and the wiring 34-4 via the connection members 35-3 and 35-4, respectively. The semiconductor element 36-3 can be a thermistor. The semiconductor element 36-3 monitors the temperature state of the semiconductor device 1 based on the difference in potential between the node P and the node N.

The wires 37-1 and 37-2 can be bonding wires. The wire 37-1 includes a first end connected to the upper surface of the semiconductor element 36-1 and a second end connected to the wiring 34-2. The portion of the upper surface of the semiconductor element 36-1 to which the wire 37-1 is connected corresponds to the source end of the transistor Tup. This allows the wire 37-1 to electrically connect the source end of the transistor Tup and the node AC. The wire 37-2 includes a first end connected to the upper surface of the semiconductor element 36-2 and a second end connected to the wiring 34-3. The portion of the upper surface of the semiconductor element 36-2 to which the wire 37-2 is connected corresponds to the source end of the transistor Tlow. This allows the wire 37-2 to electrically connect the source end of the transistor Tlow and the node N.

The sealing member 38 can be a gel-like insulator or the like. The sealing member 38 is filled into the space SP2*b*.

The bus bars 41 to 43 are conductors that electrically connect a device outside the semiconductor device 1 to the internal circuit(s) of the semiconductor device 1. The bus bars 41 to 43 extend into the spaces SP1 and SP2*b*. The bus bars 41 to 43 are, for example, copper (Cu).

Specifically, the bus bar 41 includes a terminal 41*a* and a connection portion 41*b* as end portions. The bus bar 41 is connected to the wiring 34-4 via the connection portion 41*b*.

The portion of the bus bar 41 in the space SP2b is in contact with a YZ surface of the inner case 22 (more particularly insulating film 23). The portion of the bus bar 41 in the space SP1 is covered with a protective film 45. The protective film 45 is, for example, a rubber cap layer. The protective film 45 protects the bus bar 41 from moisture and the like. The protective film 45 may be an insulator.

The bus bar 42 includes a terminal 42a and a connection portion 42b as end portions. The bus bar 42 is connected to the wiring 34-3 via the connection portion 42b. The portion of the bus bar 42 in the space SP2b is in contact with a XZ surface of the inner case 22 (more particularly, insulating film 23). The portion of the bus bar 42 in the space SP1 is covered with a protective film 46. The protective film 46 is, for example, a rubber cap layer. The protective film 46 protects the bus bar 42 from moisture and the like. The protective film 46 may be an insulator.

The bus bar 43 includes a terminal 43a and a connection portion 43b as end portions. The bus bar 43 is connected to the wiring 34-2 via the connection portion 43b. The portion of the bus bar 43 in the space SP2b is in contact with the YZ surface of the inner case 22 (more particularly, insulating film 23). The portion of the bus bar 43 in the space SP1 is covered with a protective film 47. The protective film 47 is, for example, a rubber cap layer. The protective film 47 protects the bus bar 43 from moisture and the like. The protective film 47 may be an insulator.

The semiconductor device 1 further includes a plurality of bus bars respectively corresponding to the plurality of terminals 44a. In general, these bus bars can be similar to those already described above. For example, the portions of these bus bars in the space SP2b may be in contact with a surface of the inner case 22 (more particularly, the insulating film 23 thereon). The portions of these bus bars in the space SP1 may be covered with an insulating film or the like.

The outer case 11 has a hole connecting the outside of the semiconductor device 1 to the space SP2a. The injection portion 51 is provided in this hole of the outer case 11. The injection portion 51 incorporates a mechanism that permits a refrigerant to be injected into the space SP2a. When the refrigerant is not being injected into the space SP2a, the injection portion 51 functions as a plug for preventing the injected refrigerant from flowing out of the semiconductor device 1.

The outer base substrate 10 has a hole connecting the outside of the semiconductor device 1 and the space SP2a. The discharge portion 52 is provided in this hole in the outer base substrate 10. The discharge portion 52 incorporates a mechanism that permits discharges of refrigerant from the space SP2a to the outside of the semiconductor device 1. When the refrigerant is not being discharged from the space SP2a, the discharge portion 52 functions as a plug for preventing the refrigerant from flowing out of the semiconductor device 1.

The refrigerant may be water or another liquid. A liquid refrigerant generally has heat transport properties (for example, thermal conductivity) higher than that those of air. The refrigerant is not limited to water and any liquid or fluid that can dissipate heat from the structure(s) in the inner container to the outside of the semiconductor device 1 can be used. The refrigerant is not limited to liquids and may be a gas.

As described above, the space in the outer container of the semiconductor device 1 is separated into three spaces SP1, SP2a, and SP2b. Thus, when the space SP2a is filled with the refrigerant, the refrigerant does not enter the spaces SP1 and SP2b. The space SP1 may be filled with air. The space SP2b is filled with the sealing member 38.

1.2 Heat Dissipation

Next, the heat dissipation in the semiconductor device 1 according to the first embodiment will be described.

Figure 5:
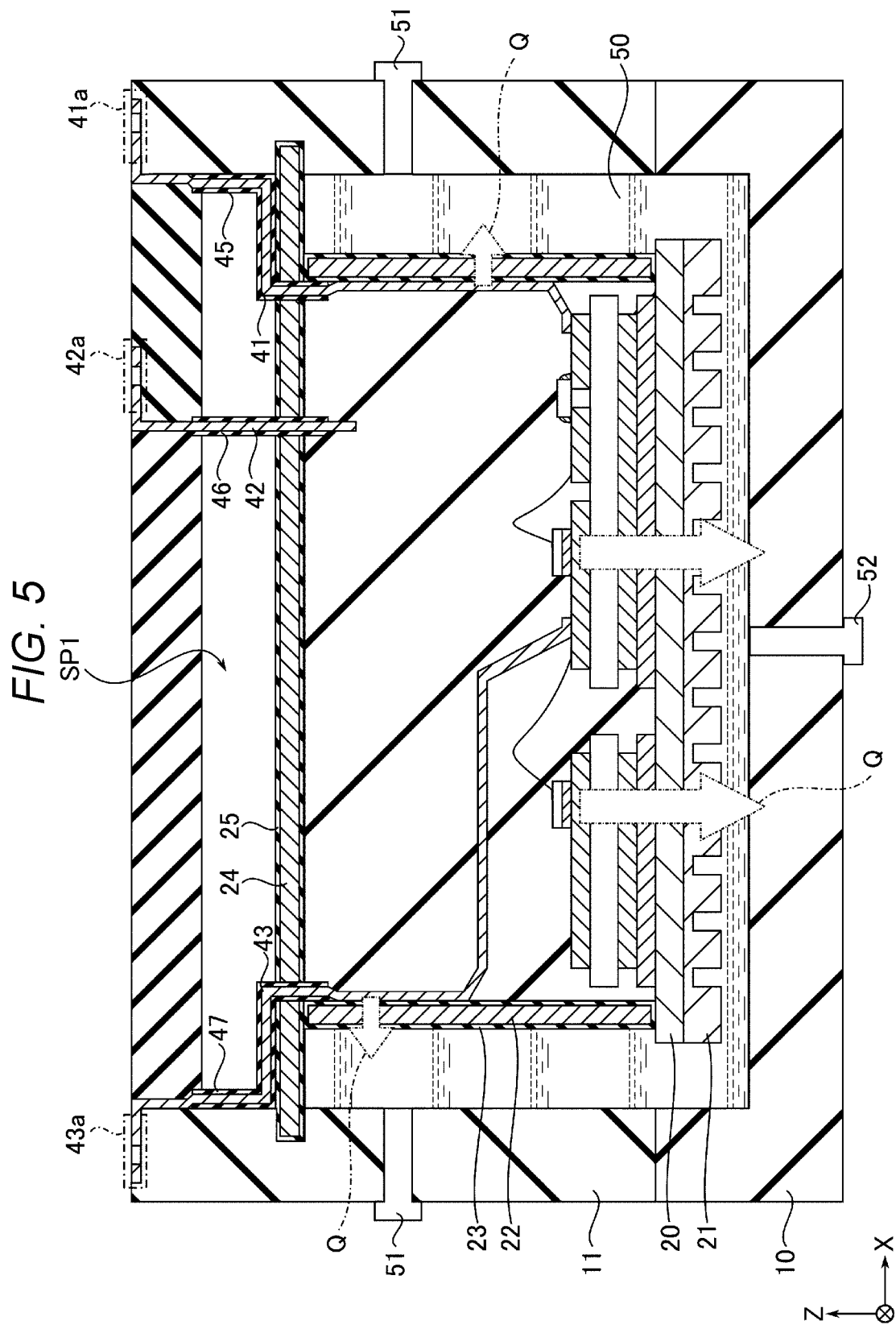
FIG. 5 is a schematic diagram depicting heat dissipation in a semiconductor device according to a first embodiment.
Figure 6:
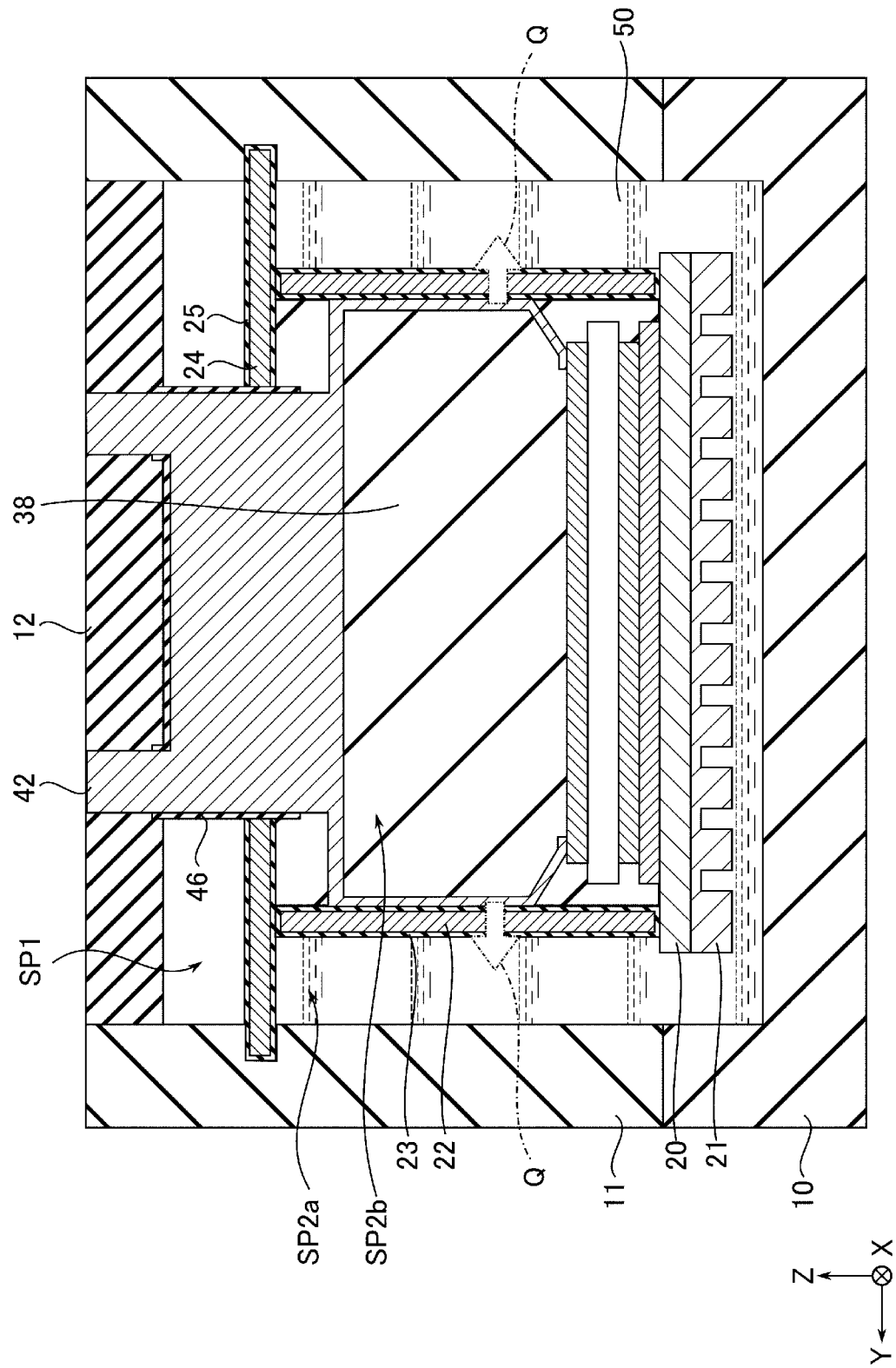
FIG. 6 is another schematic diagram depicting heat dissipation in a semiconductor device according to a first embodiment.

FIGS. 5 and 6 are schematic diagrams showing an example of heat dissipation in the semiconductor device 1 according to the first embodiment. FIGS. 5 and 6 correspond to FIGS. 3 and 4, respectively.

First, before operating the circuit configuration in the semiconductor device 1, a refrigerant 50 is injected into the space SP2a via the injection portion 51. While the refrigerant 50 is being injected, the discharge portion 52 is kept closed. As a result, the refrigerant 50 is filled into the space SP2a.

Subsequently, the circuit(s) in the semiconductor device 1 is operated. Specifically, an external device is connected to the plurality of terminals 41a to 44a. The circuit elements 36 in the semiconductor device 1 are applied with predetermined voltages via the plurality of terminals 41a to 44a.

The plurality of semiconductor elements 36 generate heat during operations of the semiconductor device 1. A heat Q generated by the plurality of semiconductor elements 36 is dissipated to the refrigerant 50 via the plurality of connection members 35, the plurality of wirings 34, the plurality of insulating substrates 33, the plurality of wirings 32, the plurality of connection members 31, the inner base substrate 20, and the heat dissipation member 21.

The heat generated by the plurality of semiconductor elements 36 transmits to the plurality of bus bars 41 to 44 via the plurality of wirings 34 and the like. Here, the plurality of bus bars 41 to 44 are in contact with the inner case 22 via the insulating film 23. Thus, the heat Q of the plurality of bus bars 41 to 44 can be dissipated to the refrigerant 50 via the insulating film 23 and the inner case 22.

When the refrigerant 50 rises to a predetermined temperature, the discharge portion 52 discharges the refrigerant 50 to the outside of the semiconductor device 1. The space SP2a is filled again with new refrigerant via the injection portion 51.

By operating as described above, the heat Q generated by operations of the semiconductor device 1 can be efficiently dissipated to the refrigerant 50.

1.3. Effects of First Embodiment

According to the first embodiment, a temperature rise of the semiconductor device 1 can be prevented or controlled.

The semiconductor device 1 includes the outer container having the outer base substrate 10, the outer case 11, and the outer lids 12 and 13. The semiconductor device 1 includes the inner container having the inner base substrate 20, the inner case 22, and the inner lid 24. The inner container is fixed in the outer container. The space in the outer container is separated into the space SP1 including the space above and outside the inner container, the space SP2a including the space on the lateral and lower sides of the inner container and space outside the inner container, and the space SP2b including space in the inner container. Thus, the space SP2a between the outer container and the side portion and the lower portion of the inner container can be used as a space for the refrigerant 50.

The plurality of semiconductor elements 36 are provided in the outer container. Thus, the heat Q transferred from the plurality of semiconductor elements 36 to the lower portion of the outer container (that is, the inner base substrate 20) can be dissipated to the refrigerant 50 in the space SP2a via the heat dissipation member 21.

The portions of the plurality of bus bars 41 to 44 that are in the space SP2b are in contact with the inner case 22 via the insulating film 23. Thus, the heat Q transferred from the plurality of semiconductor elements 36 to the plurality of bus bars 41 to 44 can be radiated to the refrigerant 50 in the space SP2a via the inner case 22 without having to pass through the sealing member 38.

The inner case 22 is a metal member and comprises aluminum (Al) or copper (Cu). On the other hand, the insulating film 23 is an electrical insulator and comprises, for example, alumina.

Thus, the plurality of bus bars 41 to 44 can be electrically insulated from the inner case 22 while still having good thermal contact with the inner case 22. That is, the insulating film is an anodized coating or the like that provides a higher thermal conductivity than that of a resin film or coating such as PPS.

The portions of the plurality of bus bars 41 to 44 that are in the space SP1 are covered with the protective films 45 to 47. Thus, the plurality of bus bars 41 to 44 can be protected from corrosion due to the refrigerant 50 even if the refrigerant 50 filled into the space SP2a penetrates into the space SP1.

The outer case 11 and the outer base substrate 10 each have the hole connecting the outside of the semiconductor device 1 to the space SP2a. The injection portion 51 is provided in the hole of the outer case 11, and the discharge portion 52 is provided in the hole of the outer base substrate 10. Thus, the refrigerant 50 can be injected into the space SP2a and then discharged to the outside of the space SP2a. Therefore, the temperature rise of the semiconductor device 1 can be limited or otherwise controlled.

2. Second Embodiment

The semiconductor device according to the second embodiment is different from the semiconductor device according to the first embodiment in that a connection portion of at least one bus bar is connected to a place other than the wirings. Hereinafter, configurations and operations different from those of the first embodiment will be mainly described. The descriptions of the configuration and operation equivalent to those of the first embodiment will be omitted as appropriate.

2.1 Cross-sectional Structure of Semiconductor Device

Figure 7:
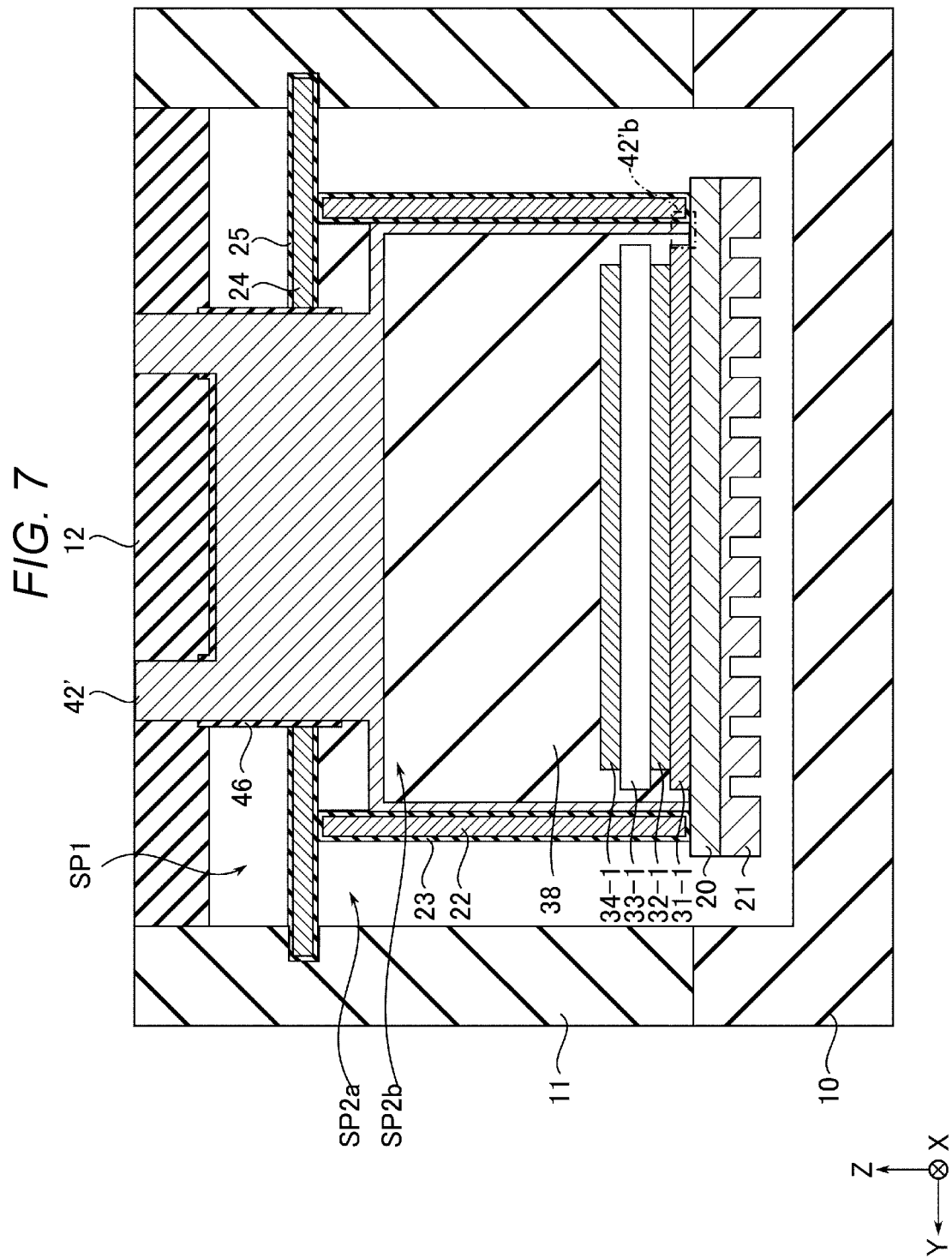
FIG. 7 is a cross-sectional view of a semiconductor device according to a second embodiment.

FIG. 7 is a cross-sectional view showing an example of a cross-sectional structure of the semiconductor device according to the second embodiment. FIG. 7 corresponds to FIG. 4 in the first embodiment.

The semiconductor device according to the second embodiment includes a bus bar 42' instead of the bus bar 42. The bus bar 42' extends in the spaces SP1 and SP2b. The bus bar 42' comprises, for example, copper (Cu). The bus bar 42' includes the terminal 42a and a connection portion 42'b as end portions. The bus bar 42' is connected to the inner base substrate 20 via the connection portion 42'b. The portion of the bus bar 42' in the space SP2b is in contact with the XZ surface of the inner case 22 (more particularly, the insulating film 23). The portion of the bus bar 42' in the space SP1 is covered with the protective film 46.

2.2. Effects of the Second Embodiment

According to the second embodiment, the connection portion 42'b of the bus bar 42' is connected to the inner base substrate 20. Thus, the node N can be grounded to the ground level of the semiconductor device 1. The plurality of semiconductor elements 36 are located above the plurality of insulating substrates 33, while the inner base substrate 20 is located below the plurality of insulating substrates 33. Thus, among currents flowing through the circuit configuration of the semiconductor device 1, a current path of the portion close to the node P and a current path of the portion close to the node N can be provided at opposite positions from the plurality of insulating substrates 33. Thus, a magnetic field generated in the current path of the portion close to the node P and a magnetic field generated in the current path of the portion close to the node N can be cancelled out. Thus, the self-inductance of the circuit configuration of the semiconductor device 1 can be reduced.

3. Modification

The present disclosure is not limited to the above-described examples, and various modifications can be applied thereto.

For example, in the first embodiment and the second embodiment the discharge portion 52 is provided on the outer base substrate 10, but examples is not limited to this arrangement.

Figure 8:
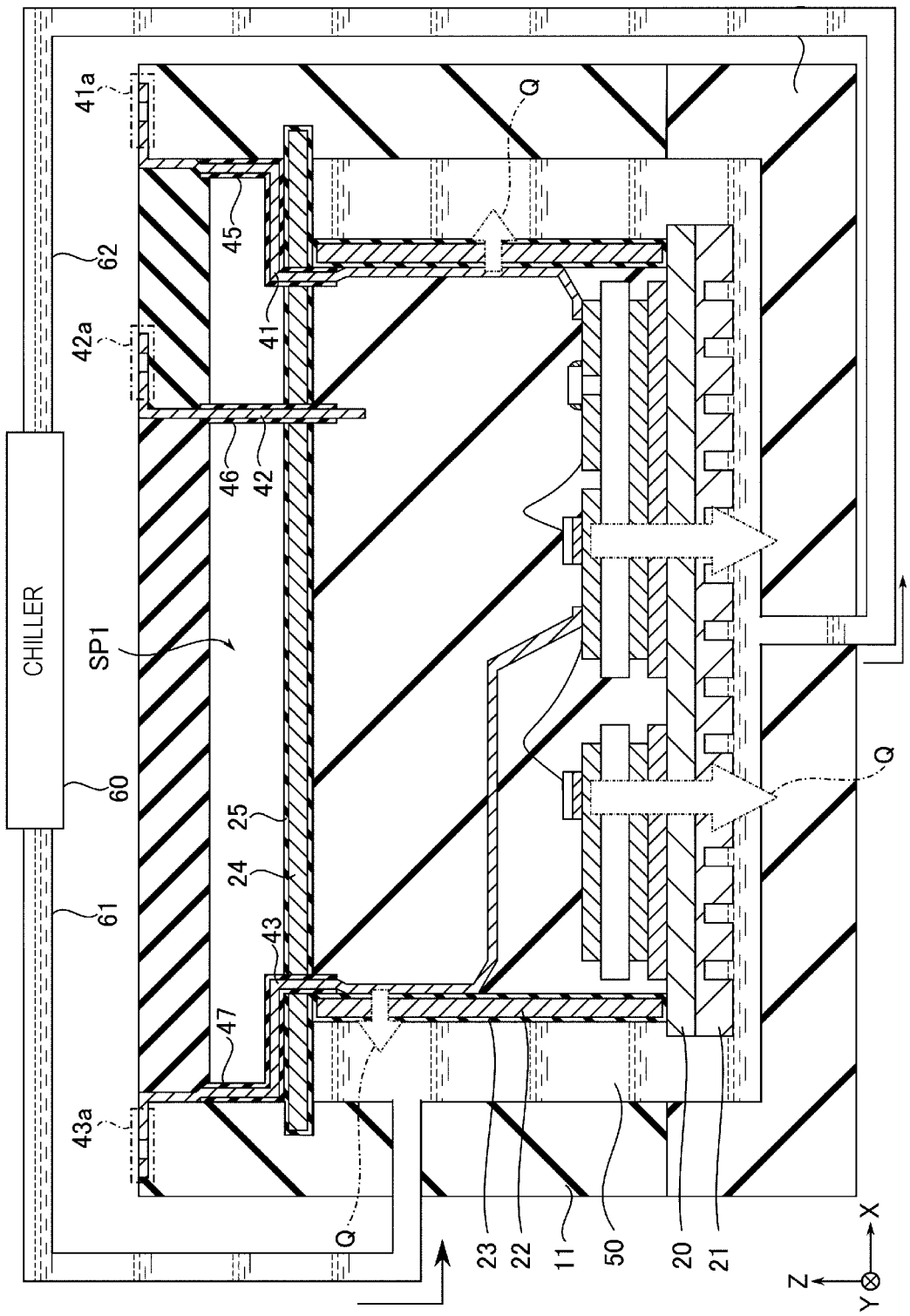
FIG. 8 is a schematic diagram depicting heat dissipation in a semiconductor device according to a modification.

FIG. 8 is a cross-sectional view showing an example of heat dissipation of a semiconductor device 1 according to a modification. FIG. 8 corresponds to FIG. 5 of the first embodiment.

The semiconductor device 1 may be connected to a chiller 60 to promote heat dissipation.

The chiller 60 includes a first end connected to an injection passage 61 and a second end connected to a discharge passage 62. The chiller 60 cools the refrigerant 50 input from the second end via the discharge passage 62. The chiller 60 outputs the cooled refrigerant 50 from the first end to injection passage 61. The injection passage 61 and the discharge passage 62 can be fluidly connected to the injection portion 51 and the discharge portion 52 of the semiconductor device 1, respectively.

After the chiller 60 is connected, the chiller 60 fills the space SP2a with the refrigerant 50. The refrigerant 50 circulates between the chiller 60 and the space SP2a while the semiconductor device 1 is operating. Thus, the temperature of the refrigerant 50 absorbing the heat Q generated by the plurality of semiconductor elements 36, can be maintained by operation of the chiller 60. As a result, the heat Q of the plurality of semiconductor elements 36 can be more efficiently absorbed. Therefore, the temperature rise of the semiconductor device 1 can be limited or otherwise controlled.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a first container;
a second container inside the first container;
a semiconductor element inside the second container; and
a chiller outside the first container and configured to inject a refrigerant into a space between the first container and the second container and to discharge the refrigerant from the space, wherein
the second container comprises:
a lower portion;
a side portion fixed to the lower portion, the side portion being a first metal material covered with a first insulator; and
an upper portion fixed to the side portion and the first container, and
the lower portion and the side portion of the second container being spaced from the first container.

2. The semiconductor device according to claim 1, wherein the upper portion of the second container comprises:
a second metal material; and
a second insulator on the second metal member.

3. The semiconductor device according to claim 2, wherein
the first metal material comprises one of aluminum or copper, and
the second metal material comprises one of aluminum or copper.

4. The semiconductor device according to claim 2, wherein the first insulator comprises alumina.

5. The semiconductor device according to claim 2, further comprising:
a conductor having a first end on the outside of the first container and a second end electrically connected to the semiconductor element, wherein
the conductor extends along an inner sidewall of the first container, and
the conductor extends along the side portion of the second container inside the second container.

6. The semiconductor device according to claim 5, further comprising:
a third insulator covering a part of the conductor that is on the upper portion of the second container.

7. The semiconductor device according to claim 5, wherein
the lower portion of the second container comprises a substrate that is copper or ceramic, and
the second end of the conductor is connected to the substrate.

8. The semiconductor device according to claim 1, wherein the first container has a sidewall extending between a lower base portion and an upper lid portion.

9. The semiconductor device according to claim 8, wherein the sidewall has a first hole and a second hole therein.

10. The semiconductor device according to claim 1, further comprising:
a heat dissipation member attached to an outer surface of the lower portion of the second container.

11. The semiconductor device according to claim 1, wherein the semiconductor element is a transistor.

12. A power module, comprising:
a first container having:
an outer base substrate,
an outer case sidewall on the outer base substrate, and
an outer lid fixed to the outer case sidewall;
a second container inside the first container, the second container having:
a lower base substrate substantially parallel to the outer base substrate and spaced from the outer base substrate,
an inner case sidewall on the lower base substrate and spaced from the outer case sidewall, and
an inner lid fixed to the inner case sidewall and the outer case sidewall, the inner lid spaced from the outer lid;
a semiconductor element mounted inside the second container; and
a first bus bar connecting a first terminal portion on the outside of the first container to the semiconductor element inside the second container, wherein
the inner case sidewall is a first metal coated with a first insulator material,
the inner lid is a second metal coated with a second insulator material, and
the first bus bar includes a portion extending along an interior sidewall of the outer case sidewall, a portion extending along an upper surface of the inner lid, a portion extending along on an interior sidewall of the inner case sidewall, and a portion on an element terminal inside the second container.

13. The power module according to claim 12, wherein
the first metal is one of aluminum or copper, and
the second metal is one of aluminum or copper.

14. The power module according to claim 12, further comprising:
a second bus bar connecting a second terminal portion on the outside of the first container to the semiconductor element inside the second container, wherein
the second bus bar includes a portion extending along an upper surface of the outer lid, a portion extending from the outer lid through the upper surface of the inner lid, and a portion extending along the inner interior sidewall of the inner case sidewall.

15. The power module according to claim 14, wherein the first and second bus bars are copper.

16. The power module according to claim 12, wherein
the first metal is aluminum, and
the first insulator material is alumina.

17. The power module according to claim 12, further comprising:
a refrigerant in a space between the first container and the second container.

18. The power module according to claim 17, further comprising:
a chiller outside the first container and configured to inject the refrigerant into the space between the first container and the second container and to discharge the refrigerant from the space.

19. A semiconductor device, comprising:
a first container;
a second container inside the first container;
a semiconductor element inside the second container; and
a chiller, wherein
the second container comprises:
a lower portion;
a side portion fixed to the lower portion, the side portion being a first metal material covered with a first insulator; and
an upper portion fixed to the side portion and the first container,
the lower portion and the side portion of the second container being spaced from the first container, the first container has a sidewall extending between a lower base portion and an upper lid portion, the sidewall has a first hole and a second hole therein, and the chiller is configured to inject a refrigerant through the first hole into a space between the first container and the second container, and discharge the refrigerant from the space through the second hole.

20. The semiconductor device according to claim 19, further comprising:

a heat dissipation member attached to an outer surface of the lower portion of the second container.

* * * * *